(12) United States Patent
McNeil et al.

(10) Patent No.: US 8,468,887 B2
(45) Date of Patent: Jun. 25, 2013

(54) RESONANT ACCELEROMETER WITH LOW SENSITIVITY TO PACKAGE STRESS

(75) Inventors: Andrew C. McNeil, Chandler, AZ (US); Yizhen Lin, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 1472 days.

(21) Appl. No.: 12/102,645

(22) Filed: Apr. 14, 2008

(65) Prior Publication Data

US 2009/0255339 A1    Oct. 15, 2009

(51) Int. Cl.
*G01P 15/00*    (2006.01)

(52) U.S. Cl.
USPC ........................................................ 73/514.15

(58) Field of Classification Search
USPC ............... 73/514.15, 514.18, 514.29, 514.32, 73/514.38; 29/596
See application file for complete search history.

(56) References Cited

U.S. PATENT DOCUMENTS

| | | | | |
|---|---|---|---|---|
| 4,114,450 A * | 9/1978 | Shulman et al. | ................ | 73/489 |
| 4,372,520 A * | 2/1983 | Shutt | ........................... | 248/604 |
| 4,398,418 A * | 8/1983 | Shutt et al. | ................ | 73/514.17 |
| 4,670,092 A * | 6/1987 | Motamedi | ..................... | 438/52 |
| 4,805,456 A | 2/1989 | Howe et al. | | |
| 5,275,055 A * | 1/1994 | Zook et al. | ...................... | 73/778 |
| 5,313,835 A | 5/1994 | Dunn | | |
| 5,444,637 A * | 8/1995 | Smesny et al. | ............... | 702/127 |
| 5,487,305 A | 1/1996 | Ristic et al. | | |
| 5,721,162 A * | 2/1998 | Schubert et al. | ............... | 438/52 |
| 5,760,305 A * | 6/1998 | Greiff | ........................ | 73/514.15 |
| 5,969,249 A * | 10/1999 | Roessig et al. | ............. | 73/514.15 |
| 5,969,250 A * | 10/1999 | Greiff | ........................ | 73/514.38 |
| 6,105,427 A * | 8/2000 | Stewart et al. | ............. | 73/514.32 |
| 6,140,144 A * | 10/2000 | Najafi et al. | .................... | 438/53 |
| 6,401,545 B1 * | 6/2002 | Monk et al. | ..................... | 73/756 |
| 6,591,678 B2 * | 7/2003 | Sakai | ......................... | 73/514.36 |
| 6,775,624 B2 * | 8/2004 | Storino | ............................ | 702/34 |
| 6,860,939 B2 * | 3/2005 | Hartzell | .......................... | 117/43 |
| 6,874,363 B1 * | 4/2005 | Foote et al. | ................ | 73/514.29 |
| 6,875,671 B2 * | 4/2005 | Faris | ............................. | 438/455 |

(Continued)

OTHER PUBLICATIONS

Seshia, A Vacuum Package Surface Micromachined Resonant Accelerometer, Journal of Microelectromechanical Systems, vol. 11, No. 6, Dec. 2002.

(Continued)

*Primary Examiner* — Peter Macchiarolo
*Assistant Examiner* — Samir M Shah
(74) *Attorney, Agent, or Firm* — Schmeiser, Olsen & Watts LLP; Lowell W. Gresham; Charlene R. Jacobsen

(57) ABSTRACT

A resonant accelerometer (24) includes a single anchor (28) fixed to a substrate (32). A proof mass (34) is positioned above a surface (30) of the substrate (32) and is positioned symmetrically about the anchor (28). The proof mass (34) has a central opening (38). Each of a number of suspension beams (42, 44, 46, 48) resides in the central opening (38) and has one end (50) affixed to the anchor (28) and another end (52) attached to an inner peripheral wall (40) of the proof mass (34). A resonant frequency of the beams (42, 44) in a direction (64) aligned with a common axis (58) of the beams (42, 44) changes according to acceleration in the direction (64). A resonant frequency of the beams (46, 48) in a direction (66) aligned with a common axis (62) of the beams (46, 48) changes according to acceleration in the direction (66).

20 Claims, 5 Drawing Sheets

U.S. PATENT DOCUMENTS

| | | | |
|---|---|---|---|
| 6,901,971 B2 * | 6/2005 | Speasl et al. | 141/1 |
| 6,936,491 B2 * | 8/2005 | Partridge et al. | 438/48 |
| 6,988,399 B1 * | 1/2006 | Watanabe et al. | 73/204.26 |
| 7,024,934 B2 | 4/2006 | Yu | |
| 7,045,878 B2 * | 5/2006 | Faris | 257/618 |
| 7,081,657 B2 * | 7/2006 | Faris | 257/415 |
| 7,178,398 B2 * | 2/2007 | Stewart | 73/514.01 |
| 7,214,625 B2 * | 5/2007 | Asami et al. | 438/719 |
| 7,223,624 B2 * | 5/2007 | Wu et al. | 438/52 |
| 7,318,349 B2 * | 1/2008 | Vaganov et al. | 73/514.33 |
| 7,425,749 B2 * | 9/2008 | Hartzell et al. | 257/414 |
| 7,716,984 B2 * | 5/2010 | Sakaguchi | 73/514.33 |
| 7,748,272 B2 * | 7/2010 | Kranz et al. | 73/493 |
| 7,882,740 B2 * | 2/2011 | Okada | 73/511 |
| 8,136,401 B2 * | 3/2012 | Hentz et al. | 73/514.29 |
| 2005/0172717 A1 * | 8/2005 | Wu et al. | 73/514.34 |
| 2006/0272413 A1 * | 12/2006 | Vaganov et al. | 73/514.01 |
| 2010/0000323 A1 * | 1/2010 | Hentz et al. | 73/514.29 |

OTHER PUBLICATIONS

Hwang, et al., Structure Design of a 2-D High-Aspect-Ratio Resonant Microbeam Accelerometer, Journal of Microlithography, Microfabrication, and Microsystems, vol. 4, Issue 3, Jul.-Sep. 2005.

* cited by examiner

RESONANT ACCELEROMETER WITH LOW SENSITIVITY TO PACKAGE STRESS

TECHNICAL FIELD OF THE INVENTION

The present invention relates generally to resonant accelerometers. More specifically, the present invention relates to a resonant accelerometer having low sensitivity to package stress.

BACKGROUND OF THE INVENTION

An accelerometer is a sensor typically utilized for measuring acceleration forces. These forces may be static, like the constant force of gravity, or they can be dynamic, caused by moving or vibrating the accelerometer. An accelerometer may sense acceleration or other phenomena along one, two, or three axes or directions. From this information, the movement or orientation of the device in which the accelerometer is installed can be ascertained. Accelerometers are used in inertial guidance systems, in airbag deployment systems in vehicles, in protection systems for a variety of devices, and many other scientific and engineering systems.

Accelerometers can be broadly categorized on the principle used to detect acceleration. These categories generally include displacement sensing and force sensing. Displacement sensing accelerometers operate by transducing the acceleration to be measured into a displacement of movable mass. This displacement can then be picked up by capacitive, optical, piezoresistive, or tunneling techniques. Since displacement sensing accelerometers require deflection, typical overload performance can have non-linearity issues, such as non-linear capacitive function, hitting stops, and so forth. In addition, displacement sensing accelerometers can suffer from "stiction", i.e., in-use sticking, and have limited sensing frequencies.

Accelerometers based on force sensing operate by directly detecting the force, or stress, applied on a proof mass. Resonant sensing of accelerations can be classified under the category of force sensing since the input acceleration is detected in terms of a shift in the resonant characteristics of a sensing device coupled to a proof mass. In one such accelerometer, one or more elongate beams are coupled between a fixed frame, or multiple fixed anchors, and a suspended proof mass. A force, which may be electrostatic, electromagnetic or piezoelectric, is applied to the beams to cause them to vibrate transversely at a resonant frequency. The accelerometer is designed so that acceleration force applied to the proof mass along a fixed axis will cause tension or compression of the beams, which changes the resonant frequency of the vibrating beams. The acceleration force applied to the proof mass can be quantified by measuring the resonant frequency of the beams.

Resonant force sensing accelerometers do not suffer from some of the problems of displacement sensing accelerometers, due in part because resonant accelerometers have very low deflections and high stiffness. In addition, resonant accelerometers have the ability to sense higher frequencies than that of, for example, capacitive displacement accelerometers.

However, a problem with the design of small, high performance resonant accelerometer sensors involves obtaining an accurate acceleration measurement in the presence of packaging-induced stress. More specifically, the conventional accelerometer design with beams extending between a fixed frame and a proof mass can impose forces from package stress on the order of one hundred to one hundred thousand times greater than the acceleration forces. Likewise, with resonant accelerometer designs that use multiple anchors at different locations, the relative locations of these multiple anchors change under conditions of elevated temperatures thereby resulting in inaccurate acceleration force measurements due to thermal stress. In addition, the operational temperature of an accelerometer changes, so that acceleration force measurements due to thermal stress is not constant. The package stress and operational temperature changes can cause significant acceleration measurement errors in resonant accelerometers.

Accordingly, what is needed is a small, high performance resonant accelerometer that is able to sense high frequencies, and in which packaging-induced stress has little effect on acceleration measurements.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Figure 1:
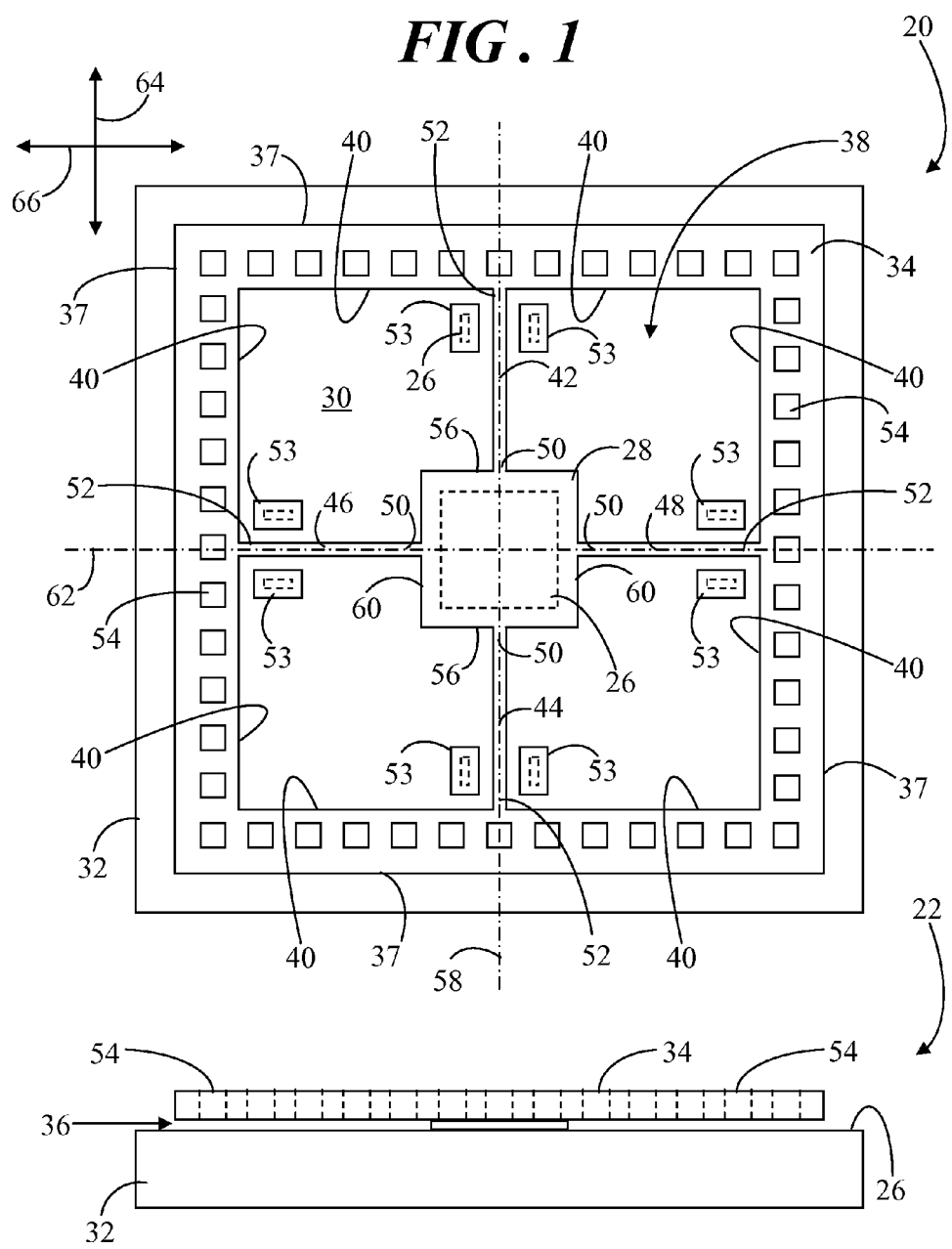
FIG. 1 shows a top view of a resonant accelerometer in accordance with an embodiment of the invention.

FIG. 1 shows a top view 20 and a side view 22 of a resonant accelerometer 24 in accordance with one embodiment of the invention. Resonant accelerometer 24 employs a force sensing technique in which input acceleration is detected in terms of a shift in the resonant characteristics of the sensing device coupled to a proof mass. Resonant accelerometer 24 may be, for example, a microelectromechanical systems (MEMS) accelerometer capable of detecting acceleration in two axes.

Resonant accelerometer 24 includes an anchor 28 formed on a surface 30 of a substrate 32. Dashed lines 26 represent the attachment of anchor 28 to an underlying portion of surface 30 of substrate 32. A proof mass 34 is positioned in parallel spaced relation above surface 30. That is, proof mass 34 is suspended above surface 30 and does not contact surface 30. This suspension is represented by a gap 36 between proof mass 34 and surface 30 visible in side view 22. Proof mass 34 is a generally planar structure having an outer peripheral wall 37 and a central opening 38 delineated by an inner peripheral wall 40.

Resonant accelerometer 24 further includes a number of substantially straight suspension beams 42, 44, 46, and 48. Each of suspension beams 42, 44, 46, and 48 has one end 50 affixed to anchor 28 and another end 52 attached to proof mass 34 at inner peripheral wall 40. Like proof mass 34, suspension beams 42, 44, 46, and 48 are suspended above surface 30 by the distance of gap 36, and do not contact surface 30. Each of beams 42, 44, 46, and 48 has fixed sense electrodes 53 associated therewith. Like anchor 28, dashed lines represent their fixed attachment to the underlying surface 30 of substrate 32. Sense electrodes are utilized to excite beams 42, 44, 46, and 48 and to sense their movement. Interconnects (discussed below) between sense electrodes 53 and excitation/sense circuitry are not shown herein for simplicity of illustration. In addition, sense electrodes 53 are not shown in side view 22 for simplicity. Interconnects (discussed below) between sense electrodes 53 and excitation/sense circuitry are not shown herein for simplicity of illustration. In addition, sense electrodes 53 are not shown in side view 22 for simplicity.

As shown in FIG. 1, proof mass 34 may be a rectangular-shaped structure and central opening 38 may be correspondingly rectangular-shaped. More specifically, proof mass 34 may be a square-shaped structure and central opening 38 may be correspondingly square-shaped. In such a configuration proof mass 34 can be positioned generally symmetrically about anchor 28. In other words, proof mass 34 is positioned about anchor 28 such that anchor 28 is located at the center of opening 38. Although the symmetry of proof mass 34 about anchor 28 is achieved through the fabrication of a square-shaped structure, it should be understood that alternative structures may be conceived, such as a circular structure for proof mass 34 with a corresponding circular central opening 38.

Proof mass 34 further includes a plurality of vent holes 54 extending through proof mass 54. Vent holes 54 facilitate the release of proof mass 34 from surface 30 of substrate 32 during manufacture. Vent holes 54 will be discussed below in connection with the fabrication of resonant accelerometer 24.

Beams 42 and 44 are affixed at opposing sides 56 of anchor 28 such that respective longitudinal axes of beams 42 and 44 form a common axis 58 through proof mass 34. Likewise, beams 46 and 48 are affixed at opposing sides 60 of anchor 28 such that respective longitudinal axes of beams 46 and 48 form another common axis 62 through proof mass 34. In particular, common axis 62 of beams 46 and 48 is perpendicular to common axis 58 of beams 42 and 44.

Common axis 58 of beams 42 and 44 is an acceleration sensitive axis in one direction of acceleration 64, and common axis 62 of beams 46 and 48 is an acceleration sensitive axis in another direction of acceleration 66. Since common axis 62 is perpendicular to common axis 58, dual axis sensing can be achieved in resonant accelerometer 24. In practice, the excitation/sense circuitry (not shown) is provided via sense electrodes 53 for vibrating beams 42, 44, 46, and 48 at their respective resonant frequency when proof mass 34 is at rest. Input acceleration in direction 64 of acceleration creates axial forces in beams 42 and 44, and input acceleration in direction 66 of acceleration creates axial forces in beams 46 and 48. The stiffness of beams 42, 44, 46, and 48 is affected by these axial forces. For example, input acceleration in direction 64 causes one of beams 42 and 44 to be loaded in tension resulting in an increase in resonant frequency, whereas in the other of beams 42 and 44 the opposite effect occurs. The two beam suspension of beams 42 and 44 yields differential acceleration output in direction 64 of acceleration. The excitation/sense circuitry (not shown) detects changes in resonant frequency via sense electrodes 53 and produces the magnitude of acceleration in direction 64. Similarly, the input acceleration relative to direction 66 of acceleration causes one of beams 46 and 48 to be loaded in tension resulting in an increase in resonant frequency, whereas in the other of beams 46 and 48 the opposite effect occurs. Thus, the two beam suspension of beams 46 and 48 yields differential acceleration output for direction 66 of acceleration. The excitation/sense circuitry (not shown) detects changes in resonant frequency via sense electrodes 53 and produces the magnitude of acceleration in direction 66.

The configuration of resonant accelerometer 24 having a single anchor 28, proof mass 34 symmetrically positioned about anchor 28, and the four beam suspension of beams 42, 44, 46, and 48 enables two axis differential acceleration sensing with one proof mass. Moreover, the single anchor 28 results in package stress having very little effect on beam stress levels. Consequently, such a configuration effectively yields a small, high performance dual axis resonant accelerometer that is able to sense frequencies in excess of ten kilohertz.

Resonant accelerometer 24 is discussed as being a dual axis sensor. In an alternative embodiment, resonant accelerometer 24 may be adapted for use as a single axis sensor. In such a configuration, for example, beams 42 and 44 may be utilized for differential acceleration output in direction 64 of acceleration and are thus exited and sensed via electrodes 53. Beams 46 and 48 would still be resident in the single axis embodiment of resonant accelerometer 24 for the purpose of supporting proof mass 34. However, beams 46 and 48 would not be excited and sensed via electrodes 53.

In the illustrated embodiment, beams 42, 44, 46, and 48 are largely equivalent in length and width. In other embodiments, beams 42 and 44 may exhibit a particular dimensional design, i.e., a particular length and width, and beams 46 and 48 may exhibit a design that differs from the design of beams 42 and 44. For example, beams 46 and 48 may differ in length and/or width relative to beams 42 and 44. A different design of beams 46 and 48 relative to beams 42 and 44 can enable resonant accelerometer to sense a different range of accelerations in different axes, e.g., 100 G in an x-direction and 500 G in a y-direction. For example, a shorter and/or wider beam has higher stiffness, and therefore, a higher resonant frequency than a longer and/or narrower beam. Thus, detectable acceleration in the two axes of resonant accelerometer 24 can be customized for particular applications. In addition, different beam designs may limit cross-talk between the pairs of beams, i.e. beams 42/44 and beams 46/48. Common mode frequency shift in response to material property variation can occur in response to temperature variation of resonant accelerometer 24. With different beam designs, it may be possible to detect and compensate for this common mode frequency shift.

Figure 2:
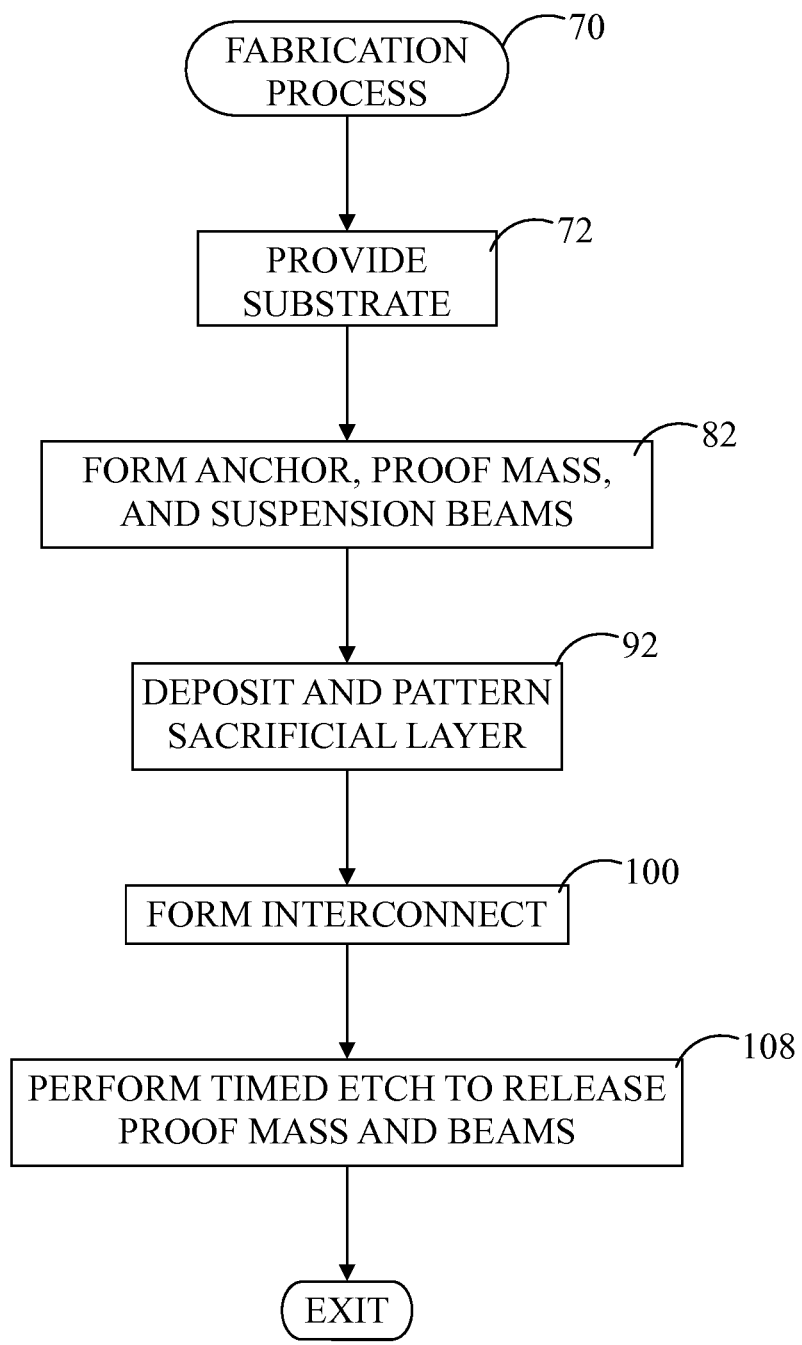
FIG. 2 shows a flowchart of a fabrication process for manufacturing the resonant accelerometer.

FIG. 2 shows a flowchart of a fabrication process 70 for manufacturing resonant accelerometer 24 (FIG. 1). In order to meet the demand for high performance and miniaturization, resonant accelerometer 24 may be a microelectromechanical systems (MEMS) device. Thus, resonant accelerometer 24 may be fabricated utilizing a number of known and upcoming MEMS fabrication processes including, for example, deposition, photolithography, etching, and so forth. Fabrication process 70 is described below in connection with the fabrication of a single MEMS resonant accelerometer 24 for simplicity of illustration. However, it should be understood by those skilled in the art that the following process allows for concurrent manufacturing of a plurality of MEMS resonant accelerometers 24. For example, multiple MEMS resonant accelerometers 24 may undergo concurrent manufacturing on substrate 32 (FIG. 1). Substrate 32 can subsequently be cut, or diced, in a conventional manner to provide individual resonant accelerometers 24.

Fabrication process 70 begins with a task 72. At task 72, substrate 32 is provided. In one embodiment, fabrication process 70 implements a silicon on insulator (SOI) technique. SOI refers to the use of a layered silicon-insulator-silicon substrate in place of conventional silicon substrates typically used in semiconductor manufacturing. SOI-based devices differ from conventional silicon-built devices in that the silicon junction is above an electrical insulator, typically a silicon oxide or (less commonly) sapphire. Silicon oxide is preferred for improved performance in microelectronics and microelectromechanical devices.

Using SOI processes, substrate 32 can be produced by several methods. One such method is known as separation by implantation of oxygen (SIMOX). SIMOX uses an oxygen ion beam implantation process followed by high temperature annealing to create a buried silicon dioxide layer. Another method, known as wafer bonding, is one in which the insulating layer is formed by directly bonding oxidized silicon with a second substrate. The majority of the second substrate is subsequently removed, the remnants forming the topmost silicon layer. Yet another method for producing SOI substrate 32 is known as a seed method in which the topmost silicon layer is grown directly on the insulator. Regardless of the SOI method utilized to provide substrate 32 at task 72, the outcome of task is a multi-layered substrate 32.

Figure 3:
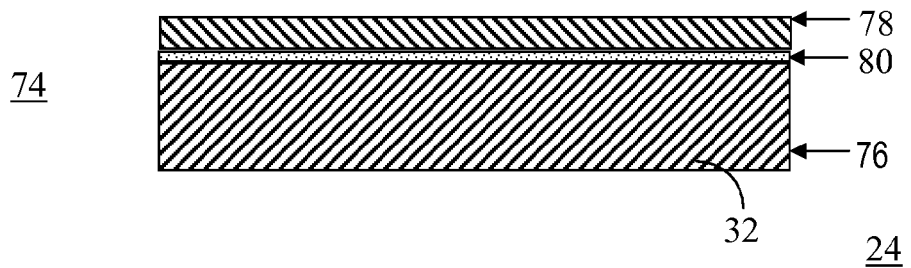
FIG. 3 shows a side view of the resonant accelerometer of FIG. 1 in a beginning stage of processing.

Referring to FIG. 3, FIG. 3 shows a side view of resonant accelerometer 24 of FIG. 1 in a beginning stage 74 of processing in accordance with task 72 of fabrication process 70. At beginning stage 74, substrate 32 is provided utilizing any of the SOI processes as discussed above. For example, using an SOI wafer bonding methodology, substrate 32 is provided that includes a silicon layer 76, a silicon layer 78, and an oxide layer 80 interposed between layers 76 and 78.

The implementation of SOI technology in fabrication process 70 is employed to enable miniaturization of MEMS resonant accelerometer 24, to reduce parasitic device capacitance, and thereby improve device performance. However, SOI is not a limitation of the present invention. Rather, alternative existing and upcoming semiconductor processing techniques may be employed to provide substrate 32 of resonant accelerometer 24.

With reference back to FIG. 2, following the provision of substrate 32 at task 72, fabrication process 70 continues with a task 82. At task 82, anchor 28, proof mass 34, suspension beams 42, 44, 46, and 48, and sense electrodes 53 are formed in layer 78 of substrate 32 by, for example, patterning and etching layer 78.

Figure 4:
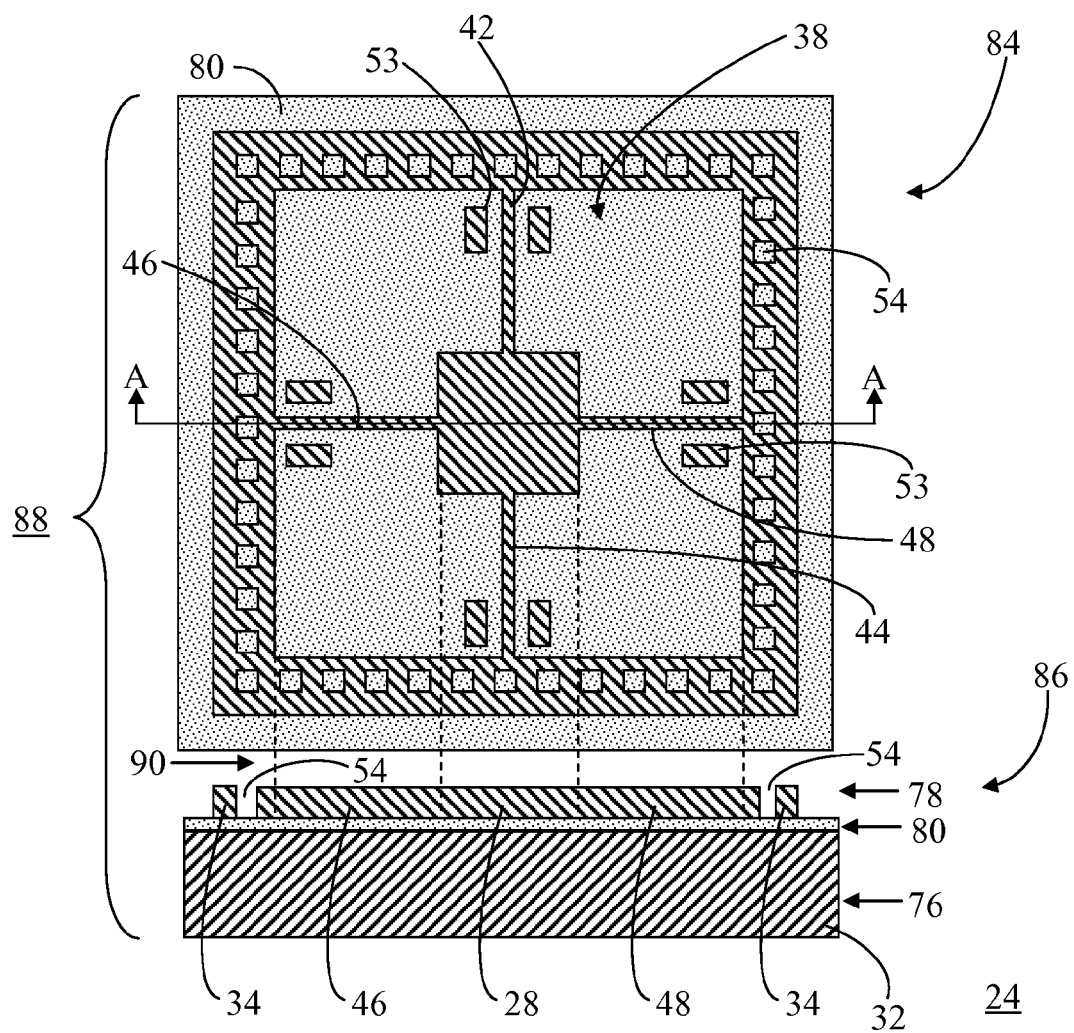
FIG. 4 shows a top view and a side view of the resonant accelerometer in a subsequent stage of processing.

FIG. 4 shows a top view 84 and a side sectional view 86 of resonant accelerometer 24 in a subsequent stage 88 of processing in accordance with task 82 of fabrication process 70. Side sectional view 86 is taken at section lines A-A of top view 84. Dashed lines 90 are illustrated between top view 84 and side sectional view 86 to delineate regions of silicon layer 78 that form the various structures of resonant accelerometer 24. Thus, in side sectional view 86, anchor 28, proof mass 34, vent holes 54 in proof mass 34, and beams 46 and 48 are visible.

Central opening 38 is formed through silicon layer 78 by executing the etching and patterning processes of task 72. Similarly, vent holes 54 are formed through silicon layer 78. The remaining material of silicon layer 78 forms anchor 28, proof mass 34, suspension beams 42, 44, 46, and 48, and sense electrodes 53. It should be noted that suspension beams 42, 44, 46, and 48 are significantly narrower than anchor 28 and sense electrodes 53. In addition, the remaining structure of proof mass 34 is made reasonably narrow between inner peripheral wall 40 and outer peripheral wall 37, relative to anchor 28, through the inclusion of vent holes 54. This is to facilitate the release of proof mass 34 and beams 42, 44, 46, and 48 from the underlying silicon layer 76 of substrate 32 with, for example, an isotropic etchant (discussed below).

Referring back to FIG. 2, following task 82, fabrication process 70 continues with a task 92. At task 92, a sacrificial oxide or phosphosilicate glass (PSG) is deposited over anchor 28, proof mass 34, suspension beams 42, 44, 46, and 48, and sense electrodes 53 of layer 78. This sacrificial oxide layer is then patterned.

Figure 5:
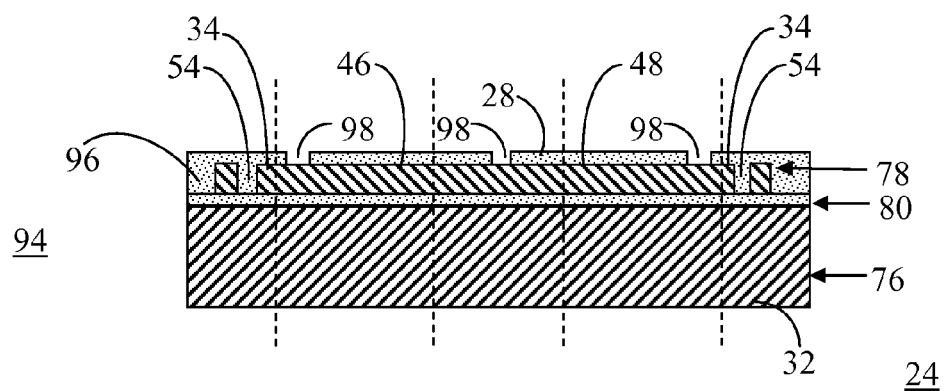
FIG. 5 shows a side view of the resonant accelerometer in a subsequent stage of processing.

FIG. 5 shows a side view of the resonant accelerometer in a subsequent stage 94 of processing in accordance with task 92 of fabrication process 70. As shown in this exemplary illustration, a sacrificial oxide 96 has been deposited over anchor 28, proof mass 34, suspension beams 42, 44, 46, and 48, and sense electrodes 53 of layer 78. It should be noted that sacrificial oxide 96 may largely fill vent holes 54 during deposition. However, sacrificial oxide 96 need not necessarily fill central opening 38 (not visible). Following deposition, sacrificial oxide 96 is patterned. For example, vias 98 may be patterned in sacrificial oxide 98 to expose underlying regions in layer 78. In this exemplary illustration, three vias 98 are shown exposing portions of layer 78.

With reference back to FIG. 2, fabrication process 70 continues with a task 100. At task 100, a polysilicon layer is deposited and patterned on top of sacrificial oxide 96. Following patterning, the remaining portion of the polysilicon layer will form an interconnect layer over anchor 28, proof mass 34, suspension beams 42, 44, 46, and 48, and sense electrodes 53.

Figure 6:
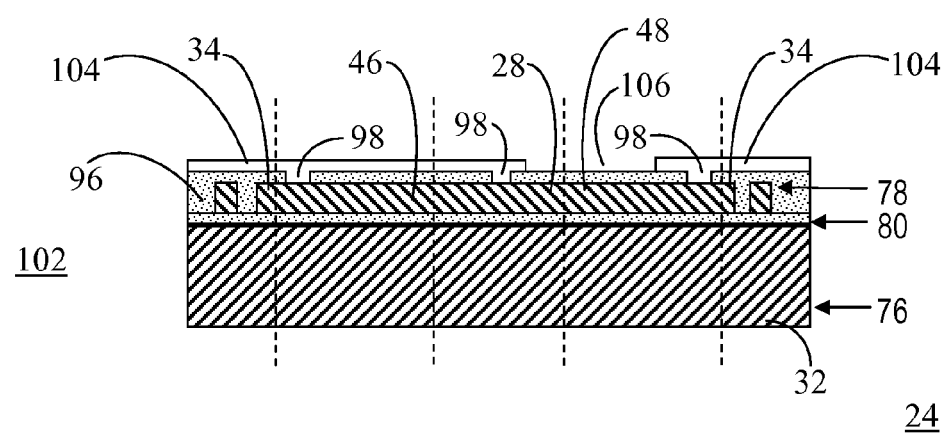
FIG. 6 shows a side view of the resonant accelerometer in a subsequent stage of processing.

FIG. 6 shows a side view of resonant accelerometer 24 in a subsequent stage 102 of processing in accordance with task 100 of fabrication process 70. As shown, a polysilicon layer 104 has been deposited over sacrificial oxide 96. It should be noted that polysilicon layer 104 may largely fill vias 98 during deposition thus forming a path of electrical conductivity to the underlying structures of, in this instance, anchor 28 and sense electrodes 53 (not visible). FIG. 6 also shows that a portion of polysilicon layer 104 has been removed by, for example, patterning and/or etching. This missing portion of polysilicon layer 104 is represented by the discontinuity of polysilicon layer 104 in a region 106. Although polysilicon is used for layer 104, it should be understood that other electrically conductive materials, such as a metal layer, may alternatively be utilized.

Referring back to FIG. 2, following task 100, fabrication continues with a task 108. At task 108, a timed etch process is performed to release proof mass 34 and beams 42, 44, 46, and 48 from the underlying substrate 32, i.e., silicon layer 76 (FIG. 3). Etching is a well known method for selective removal of a material. The degree of etching or material removal is controlled by using the etching time and the known etch rate of the material. In this instance, etching is performed to remove sacrificial layer 96 and a portion of oxide layer 80 (FIG. 3). Specifically, the timed etching task 108 removes that portion of oxide layer 80 that underlies proof mass 34 and beams 42, 44, 46, and 48. In one embodiment, task 108 may utilize an isotropic etchant. An isotropic etchant is able to move laterally so as to undercut oxide layer 80 underlying, for example, proof mass 34 and beams 42, 44, 46, and 48. Etching is facilitated by the size and position of vent holes 54 in proof mass 34 through which the etchant can pass so as to release proof mass 34. Task 108, or subsequent tasks (not shown), may further include activities associated with the completion of resonant accelerometer 24 including, for example, completing electrical connections, testing, conformal coating, and the like, as the resonant accelerometer design dictates. Following task 108, fabrication process 70 exits.

Figure 7:
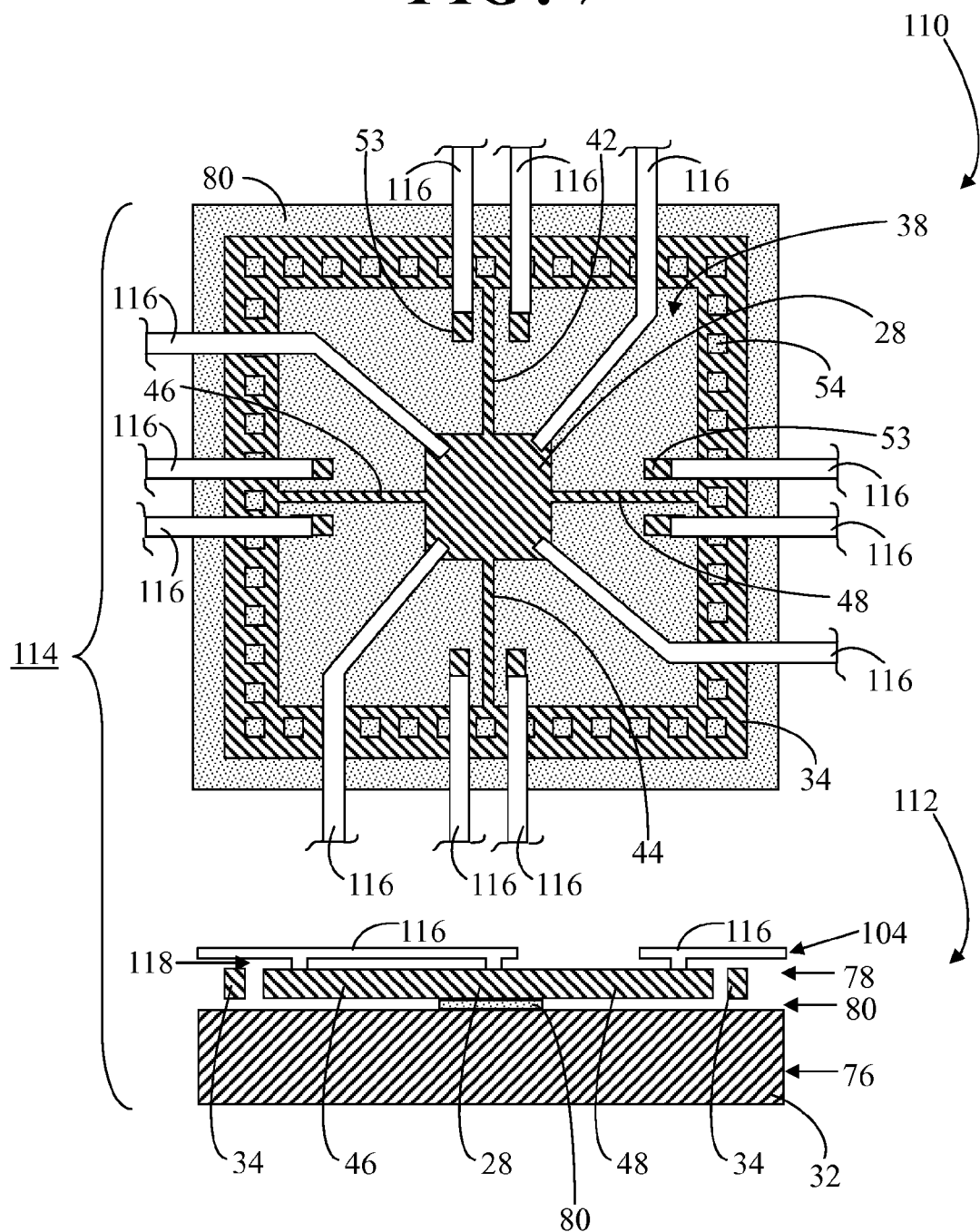
FIG. 7 shows a top view and a side view of the resonant accelerometer in a subsequent stage of processing.

FIG. 7 shows a top view 110 and a side view 112 of resonant accelerometer 24 in a subsequent stage 114 of processing in accordance with timed etch task 108 of fabrication process 70. Timed etching is performed by exposing sacrificial layer 96 and oxide layer 80 to one or more etchants for an appropriate duration to remove sacrificial layer 96 and at least a portion of oxide layer 80. As shown, polysilicon layer 104 has been patterned such that the material that remains forms interconnects 11 6. Since polysilicon layer 104 filled vias 98 (FIG. 6) during its deposition at task 100 (FIG. 2), electrical contact is made between the underlying anchor 28 and interconnects 116, as well as between the underlying sense electrodes 53 and interconnects 116. However, the remainder of interconnects 116 is separated from the underlying structure by an air gap 118.

In accordance with an embodiment, the timed etch process of task 108 (FIG. 2) is performed for a long enough duration to fully remove sacrificial layer 96 and that portion of oxide layer 80 underlying proof mass 34 and beams 42, 44, 46, and 48. Thus, proof mass 34 and beams 42, 44, 46, and 48 are released from substrate 32. However, the timed etch process is not performed for a long enough duration to remove all of oxide layer 80 underlying anchor 28. Nor is the timed etch process performed for a long enough duration to remove all of oxide layer 80 underlying sense electrodes 53 (visible only in top view 110 of FIG. 7). Oxide layer 80 underlying sense electrodes 53 is not entirely removed due to the relatively large size of sense electrodes 53 and an absence of vent holes for passage of etchant, such as vent holes 54 in proof mass 34. Consequently, anchor 28 and sense electrodes 53 remain fixed to substrate 32. It should be noted that oxide layer 80 underlying sense electrodes 53 is not shown in side view 112 in order to emphasize the release of proof mass 34 and beams 42, 44, 46, and 48 from substrate 32.

An embodiment described herein comprises a resonant accelerometer having a single anchor for suspending a proof mass and beams above a substrate. Under thermal stress, the single anchor of the resonant accelerometer may move, as is the case with prior art resonant accelerometers having multiple anchors. However, since there is only one anchor versus multiple anchors of the prior art, stress will not be induced in the sensor itself. Thus, packaging-induced stress has little effect on acceleration measurements. Accordingly, a resonant accelerometer with low sensitivity to package stress and capable of high accuracy acceleration measurements is achieved.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A resonant accelerometer comprising:
   a substrate;
   an anchor formed on a surface of said substrate;
   a proof mass positioned in parallel spaced apart relationship above said surface of said substrate, said proof mass having a central opening defined by an inner peripheral wall, said central opening extending through said proof mass; and
   suspension beams residing in said central opening, each of said suspension beams having one end affixed to said anchor and having another end attached to said proof mass at said inner peripheral wall.

2. A resonant accelerometer as claimed in claim 1 wherein said resonant accelerometer comprises a single one of said anchor.

3. A resonant accelerometer as claimed in claim 1 wherein said proof mass is positioned generally symmetrically about said anchor.

4. A resonant accelerometer as claimed in claim 1 wherein said proof mass is a rectangular-shaped structure and said opening is correspondingly rectangular-shaped.

5. A resonant accelerometer as claimed in claim 1 wherein said proof mass includes a plurality of vent holes extending through said proof mass.

6. A resonant accelerometer as claimed in claim 1 wherein said suspension beams include first and second beams affixed at first opposing sides of said anchor such that respective longitudinal axes of said first and second beams form a common axis through said proof mass.

7. A resonant accelerometer as claimed in claim 6 wherein said suspension beams include third and fourth beams affixed at second opposing sides of said anchor such that respective second longitudinal axes of said third and fourth beams form a second common axis through said proof mass, said second common axis being perpendicular to said common axis.

8. A resonant accelerometer as claimed in claim 1 wherein each of said suspension beams is substantially straight.

9. A resonant accelerometer as claimed in claim 1 wherein said suspension beams comprise:
   a first pair of beams exhibiting a first dimensional design, said first pair of beams having respective first longitudinal axes that form a first common axis through said proof mass; and
   a second pair of beams exhibiting a second dimensional design that differs from said first design, said second pair of beams being arranged perpendicular to said first pair of beams, and said second pair of beams having respective second longitudinal axes that form a second common axis through said proof mass.

10. A resonant accelerometer as claimed in claim 1 wherein said suspension beams comprise:
    a first pair of beams, said first pair of beams having respective first longitudinal axes that form a first common axis through said proof mass, wherein a resonant frequency of each of said first pair of beams in a first direction aligned with said first common axis changes in accordance with acceleration in said first direction; and
    a second pair of beams arranged perpendicular to said first pair of beams, said second pair of beams having respective second longitudinal axes that form a second common axis through said proof mass, said second common axis being perpendicular to said first common axis, wherein said resonant frequency of each of said second pair of beams in a second direction aligned with said second common axis changes in accordance with said acceleration in said second direction.

11. A resonant accelerometer as claimed in claim 1 wherein said resonant accelerometer is a microelectromechanical systems (MEMS) sensor.

12. A resonant accelerometer comprising:
    a substrate;
    an anchor formed on a surface of said substrate;
    a proof mass positioned in parallel spaced apart relationship above said surface of said substrate, said proof mass having a central opening extending through said proof mass, said proof mass being positioned generally symmetrically about said anchor;
    suspension beams residing in said central opening, each of said suspension beams having one end affixed to said anchor and having another end attached to said proof mass at an inner peripheral wall of said central opening, said suspension beams including:
       first and second beams having respective first longitudinal axes that form a first common axis through said proof mass; and third and fourth beams having respective second longitudinal axes that form a second common axis through said proof mass, said second common axis being perpendicular to said first common axis.

13. A resonant accelerometer as claimed in claim 12 wherein a resonant frequency of each of said first and second beams in a first direction aligned with said first common axis changes in accordance with acceleration in said first direction, and said resonant frequency of said third and fourth beams in a second direction aligned with said second common axis changes in accordance with said acceleration in said second direction.

14. A resonant accelerometer as claimed in claim 12 wherein said proof mass includes a plurality of vent holes extending through said proof mass.

15. A resonant accelerometer as claimed in claim 12 wherein said resonant accelerometer is a microelectromechanical systems (MEMS) sensor.

16. A microelectromechanical systems (MEMS) resonant accelerometer comprising:
 a substrate;
 a single anchor formed on a surface of said substrate;
 a proof mass positioned in parallel spaced apart relationship above said surface of said substrate, said proof mass having a central opening defined by an inner peripheral wall, said central opening extending through said proof mass, and said proof mass being positioned generally symmetrically about said anchor; and
 suspension beams residing in said central opening, each of said suspension beams having one end affixed to said anchor and having another end attached to said proof mass at said inner peripheral wall.

17. A resonant accelerometer as claimed in claim 16 wherein said proof mass is a rectangular-shaped structure and said opening is correspondingly rectangular-shaped.

18. A resonant accelerometer as claimed in claim 16 wherein said suspension beams include first and second beams in spaced apart relationship above said substrate, said first and second beams being affixed at first opposing sides of said anchor such that respective longitudinal axes of said first and second beams form a common axis through said proof mass.

19. A resonant accelerometer as claimed in claim 18 wherein said suspension beams include third and fourth beams in spaced apart relationship above said substrate, said third and fourth beams being affixed at second opposing sides of said anchor such that respective second longitudinal axes of said third and fourth beams form a second common axis through said proof mass, said second common axis being perpendicular to said common axis.

20. A resonant accelerometer as claimed in claim 16 wherein said suspension beams comprise:
 a first pair of beams, said first pair of beams having respective first longitudinal axes that form a first common axis through said proof mass, wherein a resonant frequency of each of said first pair of beams in a first direction aligned with said first common axis changes in accordance with acceleration in said first direction; and
 a second pair of beams arranged perpendicular to said first pair of beams, said second pair of beams having respective second longitudinal axes that form a second common axis through said proof mass, said second common axis being perpendicular to said first common axis, wherein said resonant frequency of each of said second pair of beams in a second direction aligned with said second common axis changes in accordance with said acceleration in said second direction.

* * * * *